US012622077B2

(12) United States Patent
Kim et al.

(10) Patent No.: US 12,622,077 B2
(45) Date of Patent: May 5, 2026

(54) IMAGE SENSOR INCLUDING JUNCTIONLESS TRANSFER TRANSISTOR

(71) Applicant: SAMSUNG ELECTRONICS CO., LTD., Suwon-si (KR)

(72) Inventors: Junoh Kim, Suwon-si (KR); Munhwan Kim, Suwon-si (KR); Hyeonseop Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 383 days.

(21) Appl. No.: 18/386,871

(22) Filed: Nov. 3, 2023

(65) Prior Publication Data

US 2024/0347563 A1     Oct. 17, 2024

(30) Foreign Application Priority Data

Apr. 13, 2023     (KR) ........................ 10-2023-0049031

(51) Int. Cl.
*H10F 39/00*          (2025.01)
*H10F 39/12*          (2025.01)

(52) U.S. Cl.
CPC ..... *H10F 39/80377* (2025.01); *H10F 39/199* (2025.01); *H10F 39/802* (2025.01); *H10F 39/80373* (2025.01); *H10F 39/812* (2025.01); *H10F 39/813* (2025.01)

(58) Field of Classification Search
CPC ..... H10F 39/18–1898; H10F 39/80373; H10F 39/80377; H10F 39/812; H10F 39/813
See application file for complete search history.

(56) References Cited

U.S. PATENT DOCUMENTS

| | | | |
|---|---|---|---|
| 8,519,456 B2 | 8/2013 | Masagaki et al. | |
| 9,240,512 B2 | 1/2016 | Kim et al. | |
| 10,388,682 B2 | 8/2019 | Jin | |
| 10,868,059 B2 | 12/2020 | Jin et al. | |
| 11,417,691 B2 | 8/2022 | Park et al. | |
| 2022/0005846 A1 | 1/2022 | Mun et al. | |
| 2023/0268358 A1* | 8/2023 | Jin ...................... | H10F 39/8033 |
| | | | 257/438 |
| 2024/0204015 A1* | 6/2024 | Lee ..................... | H10F 39/8063 |

* cited by examiner

*Primary Examiner* — Brent A. Fairbanks
*Assistant Examiner* — Molly K Reida
(74) *Attorney, Agent, or Firm* — Sughrue Mion, PLLC

(57)     ABSTRACT

An image sensor includes a substrate, a polysilicon-vertical gate, a photoelectric conversion element, a channel, and a floating diffusion region. The substrate has a front surface and a back surface that opposes the front surface. The polysilicon-vertical gate is disposed in an upper region adjacent to the front surface of the substrate and extends into the substrate. The photoelectric conversion element is disposed at a lower position within the substrate with respect to the polysilicon-vertical gate. The channel is disposed adjacent to the polysilicon-vertical gate and doped with dopants of a same conductivity type as the photoelectric conversion element. The floating diffusion region is disposed in the upper region of the substrate and adjacent to the polysilicon-vertical gate in a first parallel direction that is parallel to the front surface of the substrate. The polysilicon-vertical gate, the photoelectric conversion element, and the floating diffusion region constitute a junctionless transfer transistor.

20 Claims, 17 Drawing Sheets

100a

100a

100b

100b

400

IMAGE SENSOR INCLUDING JUNCTIONLESS TRANSFER TRANSISTOR

CROSS-REFERENCE TO RELATED APPLICATION

This application claims priority to Korean Patent Application No. 10-2023-0049031, filed on Apr. 13, 2023, in the Korean Intellectual Property Office, the disclosure of which being incorporated by reference herein in its entirety.

BACKGROUND

The present disclosure relates to an image sensor including a junctionless transfer transistor.

An image sensor is a device that converts an optical image into an electrical signal. Image sensors are classified into charge-coupled device (CCD) image sensors and complementary metal-oxide-semiconductor (CMOS) image sensors.

Noise in an image, captured at a low illuminance, is an important issue in image sensor technology. As a type of noise, point fixed pattern noise (pFPN) caused by transistor parameters has an important meaning in terms of low-illuminance noise of an image sensor. Signal loss, caused by interface trap of a transistor, is known as one of the causes of pFPN.

SUMMARY

It is an aspect to provide an image sensor with reduced noise.

According to an aspect of one or more example embodiments, an image sensor may include a substrate having a front surface and a back surface that opposes the front surface; a polysilicon-vertical gate disposed in an upper region adjacent to the front surface of the substrate and extending into the substrate; a photoelectric conversion element disposed at a lower position within the substrate with respect to the polysilicon-vertical gate; a channel disposed adjacent to the polysilicon-vertical gate and doped with dopants of a same conductivity type as the photoelectric conversion element; and a floating diffusion region disposed in the upper region of the substrate and adjacent to the polysilicon-vertical gate in a first parallel direction that is parallel to the front surface of the substrate, wherein the polysilicon-vertical gate, the photoelectric conversion element, and the floating diffusion region constitute a junctionless transfer transistor.

According to another aspect of one or more example embodiments, an image sensor may include a substrate having a front surface and a back surface that opposes the front surface; a polysilicon-vertical gate disposed in an upper region adjacent to the front surface of the substrate and extending into the substrate; a photoelectric conversion element that is disposed at a lower position within the substrate with respect to the polysilicon-vertical gate and that is doped with dopants of a first conductivity type that is different from a second conductivity type of the polysilicon-vertical gate; a channel disposed adjacent to the polysilicon-vertical gate and doped with dopants of the first conductivity type; and a floating diffusion region that is formed in an upper position of the substrate adjacent to the polysilicon-vertical gate in a first parallel direction that is parallel to the front surface of the substrate, and doped with dopants of the first conductivity type, wherein the photoelectric conversion element accumulates photocharges corresponding to an intensity of incident light when a negative voltage is applied to the polysilicon-vertical gate, and transfers the accumulated photocharges to the floating diffusion region through the channel in the polysilicon-vertical gate when the negative voltage applied to the polysilicon-vertical gate is released.

According to yet another aspect of one or more example embodiments, an image sensor may include a pixel array comprising a plurality of pixels; and a control circuit configured to transmit a control signal to a plurality of transfer transistors included in each of the plurality of pixels. Each of the plurality of pixels comprises a polysilicon-vertical gate of a transfer transistor, the polysilicon-vertical gate being disposed in an upper region adjacent to a front surface of a substrate and extending into the substrate; a photoelectric conversion element that is doped with dopants of a first conductivity type that is different from a second conductivity type of the polysilicon-vertical gate, the photoelectric conversion element being disposed at a lower position within the substrate with respect to the polysilicon-vertical gate; a channel disposed adjacent to the polysilicon-vertical gate and doped with dopants of the first conductivity type; and a floating diffusion region that is spaced apart from the photoelectric conversion element and doped with dopants of the first conductivity type and that stores charges transferred from the photoelectric conversion element through the channel in the polysilicon-vertical gate, wherein the charges of the photoelectric conversion element are transferred to the floating diffusion region through the channel without passing through a PN junction.

BRIEF DESCRIPTION OF DRAWINGS

The above and other aspects will be more clearly understood from the following detailed description, taken in conjunction with the accompanying drawings, in which.

DETAILED DESCRIPTION

Among CMOS image sensors, an active pixel sensor (APS) includes a transfer transistor. The transfer transistor transfers electrical charges, accumulated when an optical signal is incident on a photodiode PD, to a floating diffusion region.

As described above, noise in an image, captured at a low illuminance, is an important issue in image sensor technology. As an example, point fixed pattern noise (pFPN) caused by transistor parameters has an important meaning in terms of low-illuminance noise of an image sensor. Signal loss, caused by interface trap of a transistor, is known as one of the causes of pFPN.

Hereinafter, example embodiments will be described with reference to the accompanying drawings.

Figure 1:
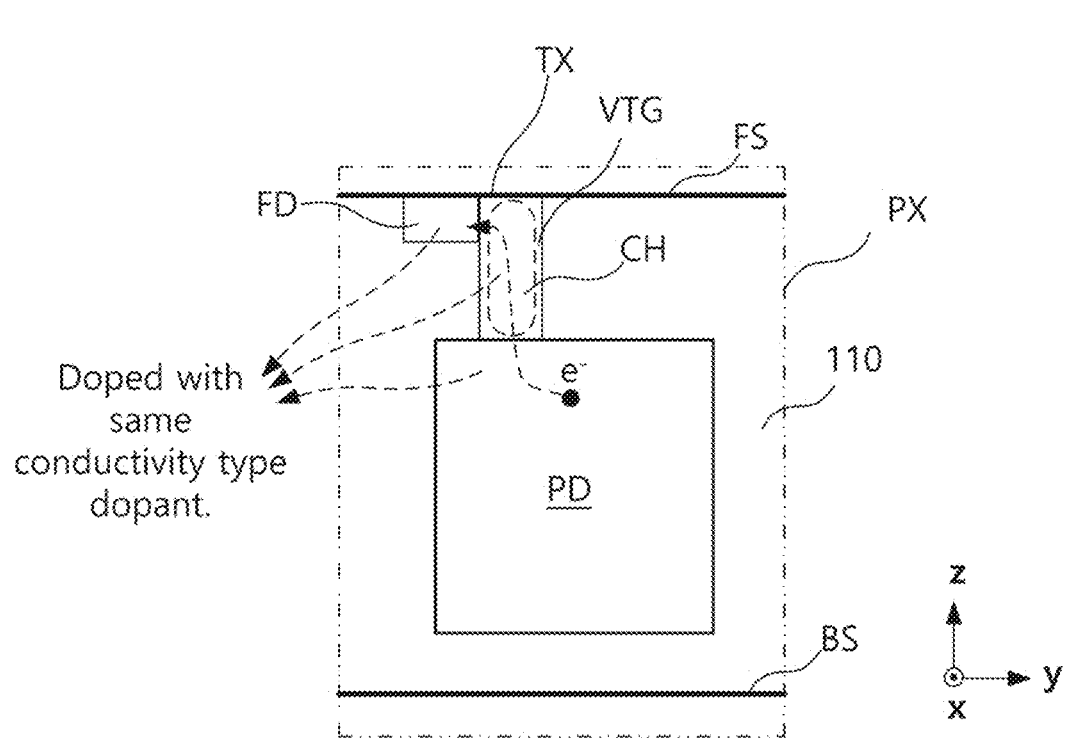
FIG. 1 is a block diagram illustrating a pixel of an image sensor according to an example embodiment.

FIG. 1 is a block diagram illustrating a pixel of an image sensor 100 according to an example embodiment. Referring to FIG. 1, the image sensor 100 may include a substrate 110, a transfer transistor TX, a photodiode PD, and a floating diffusion region FD.

When a substrate is a P-type substrate, the substrate may constitute a photodiode PD together with a region doped with N-type dopants. In this case, in example embodiments, the region doped with the N-type dopants is referred to as a photodiode PD.

The substrate 110 may be a substrate in which a P-type epitaxial layer is formed on a P-type bulk silicon substrate, different from an N-type doped region having a conductivity type different from a conductivity type of the photodiode PD, for example, in which the photodiode PD is doped with N-type dopants. The photodiode PD may be formed at the P-type epitaxial layer, and the bulk silicon substrate may be removed from the substrate 110. In some example embodiments, a P-type epitaxial layer may be formed on N-type bulk silicon, and an N-type doped region constituting the photodiode PD may be formed in the epitaxial layer.

In some example embodiments, the substrate 110 may include P-type well regions in which an N-type doped region is disposed. In some example embodiments, the substrate may be a silicon-on-insulator (SOI) substrate.

The image sensor 100 may include a plurality of pixels PX, and the pixels PX may be arranged in a two-dimensional (2D) array structure to constitute a pixel array. The pixel array may include pixels PX disposed in a first direction (an X-direction) and a second direction (a Y-direction), parallel to a front surface FS of the substrate 110. The substrate 110 may have a back surface BS that opposes the front surface FS, and a space between the front surface FS and the back surface BS of the substrate 110 may constitute an inside of the substrate 110 in a third direction (a Z-direction), parallel to the first direction (the X-direction) and the second direction (the Y-direction).

A pixel PX may include a photoelectric conversion element, a transfer transistor TX, and a floating diffusion region FD. The pixel PX may have a four-transistor (4T) structure including a reset transistor RX, a source-follower transistor SF, and a select transistor SX to be described with reference to FIG. 2, and may have any one structure, among 5T, 6T, and 7T structures further including other transistors according to various example embodiments.

The photoelectric conversion element may be a photodiode PD. The photodiode PD may a type of photoelectric conversion element that generates charges in proportion to an externally incident optical signal and accumulates the generated charges. The charges may be photocharges. The photoelectric conversion element may be one of a photodiode PD, a photocapacitor, a photogate, a pinned photodiode PPD, and a partially pinned photodiode, or a combination thereof. Example embodiments will be described on the assumption that a photoelectric conversion element is a photodiode PD, but the above-mentioned other photoelectric conversion elements may be used and the photoelectric conversion element is not limited to a photodiode PD.

The transfer transistor TX according to an example embodiment may have a polysilicon-vertical gate VTG in which a plurality of gates extend into the substrate 110 in the second direction (the Z-direction) and are oriented vertically to the front surface FS of the substrate 110. The polysilicon-vertical gate VTG may operate as a gate node of the transfer transistor TX.

Embodiments described with reference to FIGS. 1 to 9 will be described on the assumption that two polysilicon-vertical gates (VTGs) are provided.

The polysilicon-vertical gate VTG may be disposed in an upper region adjacent to the front surface FS of the substrate 110 with respect to the photodiode PD. The photodiode PD may be disposed at a lower portion of the inside of the substrate 110 with respect to the polysilicon-vertical gate VTG and may be spaced apart from the front surface FS of the substrate 110.

Pixels according to example embodiments will be described on the assumption that backside illumination (BIS) technology is used in which an optical signal enters through a backside BS of the substrate 110.

Although not illustrated in FIG. 1, transistors other than the transfer transistor TX may be formed on the front surface FS of the substrate 100 or may be formed adjacent to the front surface FS of the substrate 100.

Charges accumulated in the photodiode PD may be transferred to the floating diffusion region FD of the transfer transistor TX after exposure thereof is completed. The charges may be transferred to the floating diffusion region FD through a channel CH in the polysilicon-vertical gate VTG of the transfer transistor TX. The floating diffusion region FD may be disposed in an upper region of the substrate 110 adjacent to the polysilicon-vertical gate VTG in a first direction (the X-direction) that is parallel to the front surface FS of the substrate 110.

Each of the photodiode PD and the floating diffusion region FD may be either one of a source node and a drain node of the transfer transistor TX. For example, in a configuration in which the photodiode PD operates as a source node and the transfer transistor TX is turned on, the charges accumulated in the photodiode may be transferred to the floating diffusion region FD, a drain node.

A detailed description will be provided with reference to FIG. 1. The charges accumulated in the photodiode PD may be moved upwardly of the channel CH in the polysilicon-vertical gate VTG disposed above the photodiode PD. The charges moved to the channel CH may be moved again in a horizontal direction to the floating diffusion region FD in which a reset voltage generated by the reset transistor RX is set.

The transfer transistor TX according to an example embodiment may be a junctionless transfer transistor TX, a type of junctionless transistor. For example, the photodiode PD, the channel CH in the polysilicon-vertical gate VTG, and the floating diffusion region FD may all be doped with impurities of the same conductivity type. Accordingly, electrons of the photodiode PD may be transferred to the floating diffusion region FD through the channel CH in the polysilicon-vertical gate VTG without passing through a PN junction (junctionless).

The transfer transistor TX constitutes a junctionless transistor and the photodiode PD, the channel CH in the polysilicon-vertical gate VTG, and the floating diffusion region FD are all doped with impurities of the same conductivity type, thereby preventing charge trapping occurring in a vertical gate of a transfer transistor according to the related art. This prevention of charge trapping will be described below with reference to FIG. 5. Accordingly, signal loss of the floating diffusion region FD, caused by charge trapping, may be prevented to reduce pFPN.

The floating diffusion region FD may be present in an epitaxial layer, and may function as a source node of the reset transistor RX.

Figure 2:
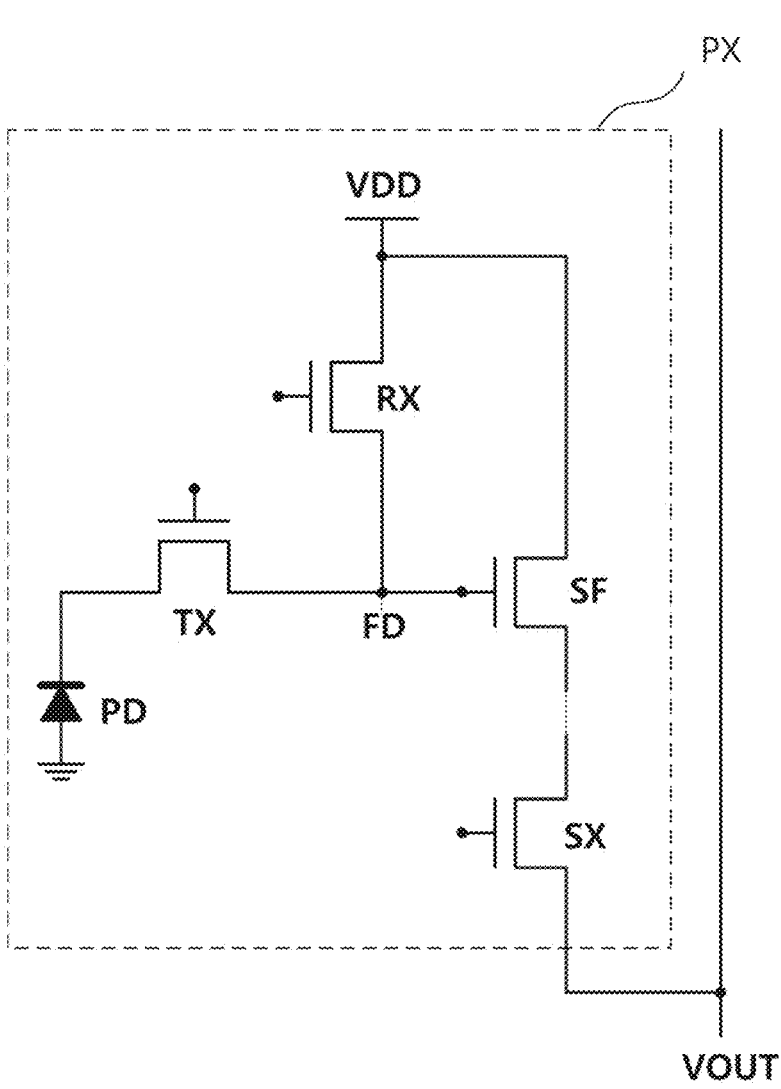
FIG. 2 is a circuit diagram of the pixel of the image sensor of FIG. 1, according to an example embodiment.

FIG. 2 is a circuit diagram of a pixel of the image sensor of FIG. 1, according to an example embodiment. The circuit of FIG. 2 will be described on the assumption that the pixel has a 4T structure, but example embodiments are not limited to the 4T structure and in some example embodiments may be applied to a 5T structure, a 6T structure, a 7T structure, or other structures.

The charges accumulated in the photodiode PD may be transferred to the floating diffusion region FD through a channel CH of the transfer transistor TX. The floating diffusion region FD may be reset to a reset voltage $V_{DD}$ by the reset transistor RX before the charges are transferred. A reset level of the floating diffusion region FD may be recorded in an additional circuit to remove noise included in the transferred charges. The floating diffusion region FD, in which the charges are stored, may change a voltage to a voltage proportional to the charges and transfer the changed voltage to a gate node of the source-follower transistor SF, and the source-follower transistor SF may output the change in the voltage on the gate node to the select transistor SX based on the selection of the select transistor SX. The select transistor SX may perform addressing as a switching role and may output the change in the voltage, received from the source-follower transistor SF, to a column line ($V_{OUT}$) when a row select signal is applied.

As described with reference to FIG. 1, the transfer transistor TX according to an example embodiment is a junctionless transistor. Since a PN junction is not present in a charge transfer path of the photoelectric conversion element, the channel CH, and the floating diffusion region FD, the channel CH may be turned on in a state in which a negative voltage is not applied to the polysilicon-vertical gate VTG. Accordingly, the transfer transistor TX may apply a negative voltage to the polysilicon-vertical gate VTG in a photocharge accumulation mode to turn off the channel CH. When a negative voltage is applied to the polysilicon-vertical gate VTG, the channel CH in the polysilicon-vertical gates VTG may be depleted and a depletion region may be formed throughout the channel CH of the transfer transistor TX. The transfer transistor TX may be turned on when the applied negative voltage is released, and the charges accumulated in the photodiode PD may be transferred to the floating diffusion region FD through the channel CH.

Figure 3:
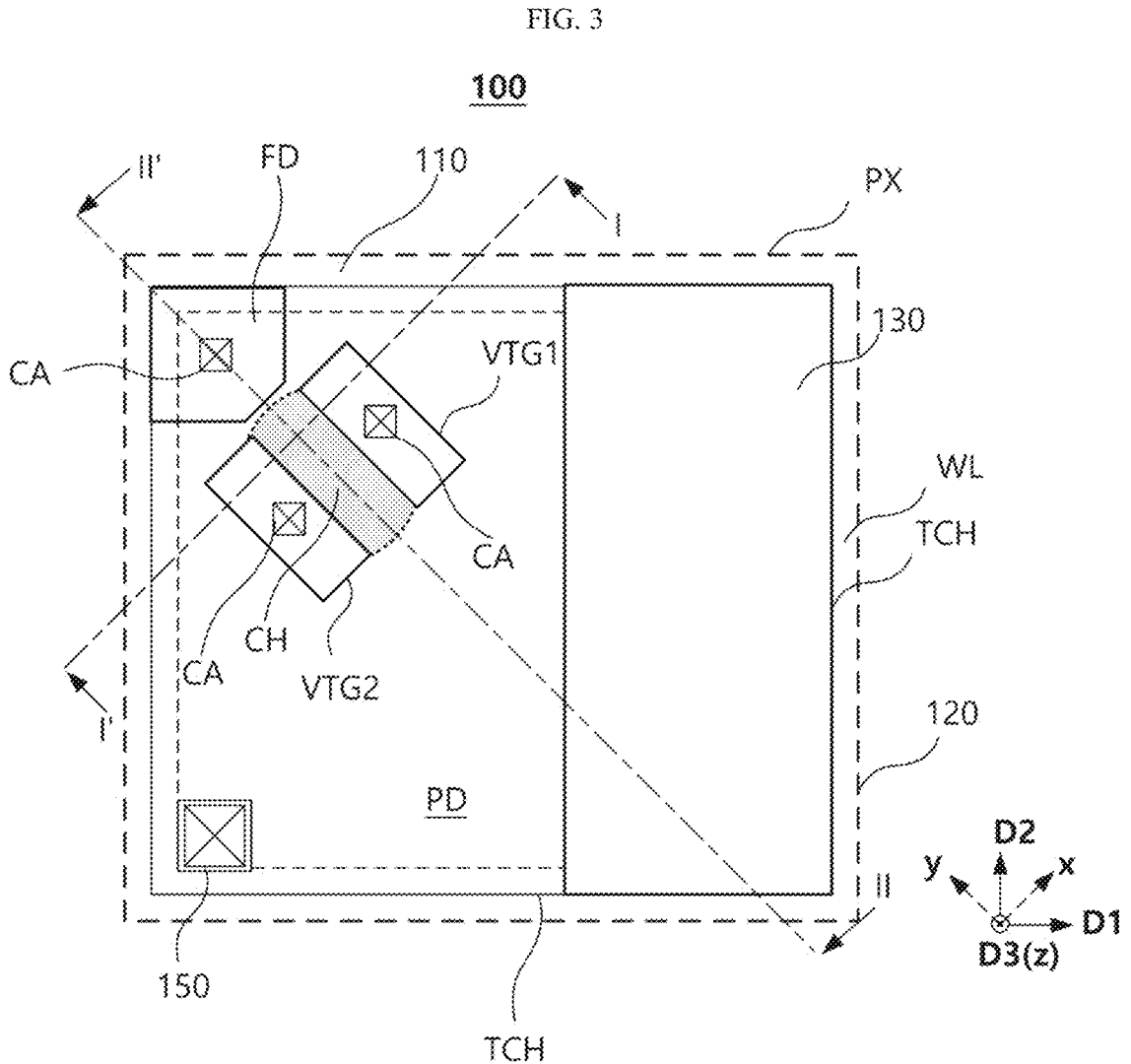
FIG. 3 is a plan view of the pixel of the image sensor of FIG. 1, according to an example embodiment.

FIG. 3 is a plan view of the pixel of the image sensor 100 of FIG. 1, according to an example embodiment. Referring to FIG. 3, a pixel of the image sensor 100 may include a substrate 110, an active region 120, a TR area 130, a photodiode PD, a floating diffusion region FD, and a plurality of polysilicon-vertical gates VTG1 and VTG2, and ground 150.

In the following drawings, the ground 150 will not be illustrated for ease of description but may be formed on a front surface FS of the substrate 110, as illustrated in FIG. 1.

The pixel may be formed in a direction in which a length thereof extends in diagonal directions D1 and D2 which represent coordinate axes between the first direction (the X-direction) and the second direction (the Y-direction).

The active region 120 may be formed to be electrically isolated by a device isolation layer, and the pixel may be formed in the active region 120 of the substrate 110. The active region 120 may include the TR area 130 in which a plurality of transistors are formed. Although not illustrated in other drawings including FIG. 3, interconnections may be formed in the TR area 130 to connect the reset transistor RX, the source-follower transistor SF, and the select transistor SX to each transistor. When viewed in plan view, in FIG. 3, the TR area 130 is illustrated as being limited to only a portion of a right side of the pixel, but a shape of the TR area 130 is not limited thereto. For example, in some example embodiments, the TR area 130 may be formed simultaneously on the right side and a lower side of the pixel, or may have another shape.

The polysilicon-vertical gates VTG1 and VTG2 may be formed in an upper region adjacent to the front surface FS of the substrate 110 and the photodiode PD may be formed in a lower region inside the substrate 110 with respect to the polysilicon-vertical gates VTG1 and VTG2, so that the TR region 130 may be secured to be wide.

In the plan view of FIG. 3, the floating diffusion region FD is illustrated as being formed adjacent to a square corner of the pixel, but example embodiments are not limited thereto.

Referring to FIG. 3, the photodiode PD may be formed to be wide below the polysilicon-vertical gate VTG and below the floating diffusion region FD on an inside of the substrate 110 closer to a back surface BS of the substrate 110 (see, e.g., FIG. 1). Accordingly, an optical signal incident through the back surface BS may be sufficiently received.

The photodiode PD according to an example embodiment may be an N-type photodiode doped with N-type dopants.

A channel CH, through which charges are transferred, may be disposed between the plurality of polysilicon-vertical gates VTG1 and VTG2 and may be formed above the photodiode PD. The channel CH, through which charges are transferred to the floating diffusion region FD, may be doped with the same N-type dopants as the photodiode PD and may be formed at a higher doping concentration than the photodiode PD. Accordingly, unlike a junctionless transistor according to the related art in which a photodiode PD and a channel CH are formed at the same doping concentration, the channel CH may be formed at a higher doping concentration than the photodiode PD to efficiently move charges, which are concentrated in the photodiode PD, to the channel CH.

In FIG. 3, the polysilicon-vertical gates VTG1 and VTG2 are illustrated as being spaced apart from each other to be separately formed. However, example embodiments are not limited thereto and, in some example embodiments, upper portions of polysilicon-vertical gates VTG adjacent to the front surface FS of the substrate 110 may be connected to each other by the same material as the polysilicon-vertical gates VTG. When the upper portions of the polysilicon-vertical gates VTG are connected to each other, the polysilicon-vertical gates VTG may surround the channel CH on three sides. The three sides may include one side, parallel to the first direction (the X-direction), and two sides parallel to the second direction (the Y-direction). In this case, regions of the polysilicon-vertical gates VTG extending into the substrate, other than upper regions of the polysilicon-vertical gates VTG that are connected to each other, may be referred to as vertical extension regions. Accordingly, when upper portions of the polysilicon-vertical gates VTG are not connected to each other as illustrated in FIG. 3, only a plurality of vertical extension regions are present.

When the polysilicon-vertical gates VTG1 and VTG2 are spaced apart from each other to be separately formed, a same bias voltage may be applied to the plurality of plurality of polysilicon-vertical gates VTG1 and VTG2 through an interconnection of a contact area.

The polysilicon-vertical gates VTG1 and VTG2 may be doped with a material of a conductivity type that is different from the conductivity type of the photodiode PD, the channel CH, and the floating diffusion region FD which are each doped with the same dopants. In an example embodiment, the photodiode PD, the channel CH, and the floating diffusion region FD may be doped with N-type dopants, and the polysilicon-vertical gates VTG1 and VTG2 may be doped with P-type dopants. As will be described below with reference to FIG. 4, the polysilicon-vertical gates VTG1 and VTG2 may be doped with P-type dopants to cause a difference in work function from an N-type channel.

According to example embodiments, as described above with reference to FIG. 2, a negative voltage may be applied to the polysilicon-vertical gate VTG of the transfer transistor TX and the transfer transistor TX may be turned off in the photocharge accumulation mode of the photodiode PD. A depletion region may be formed up to a center of the channel CH between the polysilicon-vertical gates VTG1 and VTG2 (fully depleted). Accordingly, a space between the polysilicon-vertical gates VTG1 and VTG2 may be formed to be spaced apart in the first direction (the X-direction) with the channel CH interposed therebetween by a distance at which the depletion region is formed up to the center of the channel CH. In other words, a width of the channel CH may correspond to a width of the depletion region between the polysilicon-vertical gates VTG1 and VTG2.

Figure 4:
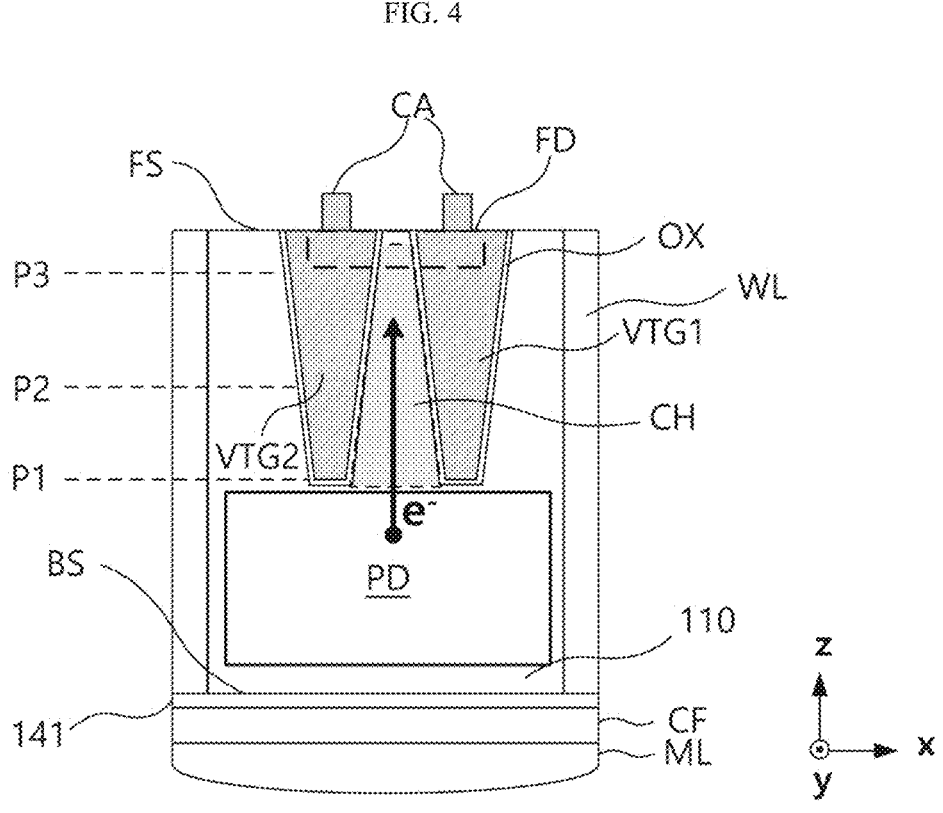
FIG. 4 is a cross-sectional view of the pixel of the image sensor of FIG. 3, taken alone a line I-I' in FIG. 3, according to an example embodiment.

FIG. 4 is a cross-sectional view of the pixel of the image sensor of FIG. 3, according to an example embodiment. FIG. 4 shows a cross-sectional view of the image sensor taken along line I-I' in FIG. 3.

The photodiode PD may be disposed below polysilicon-vertical gates VTG1 and VTG2 in a second direction (e.g., a Z direction). A transfer transistor TX may be turned on or turned off based on a change in a voltage applied to a contact area CA. In a charge transfer mode, the transfer transistor TX may be turned on and charges accumulated in the photodiode PD may be moved to the channel CH disposed to be comparatively higher than the photodiode PD. The charges of the channel CH may be moved to the floating diffusion region FD, which would be located below the surface of the paper on which FIG. 4 is printed, in the second direction (the Y-direction).

The polysilicon-vertical gates VTG1 and VTG2 may be formed at an epitaxial layer of the substrate 110, and may be surrounded by a gate insulating layer OX.

A back surface (BS) insulating layer 141, a color filter CF, and a microlens ML may be formed on a back surface BS of the substrate 110 in a path through which light is incident to the photodiode PD. For example, the color filter CF may be formed on the back surface insulating layer 141 and the microlens ML may be formed on the color filter CF.

Pixels may be separated from each other by a separation layer WL, and the separation layer WL may be formed in a deep trench isolation (DTI) structure.

The BS insulating layer 141 may include a metal oxide such as a hafnium oxide, an aluminum oxide, or a tantalum oxide, or an insulating material such as a silicon oxide, a silicon nitride, a silicon oxynitride, or a low-K dielectric material.

Figure 5:
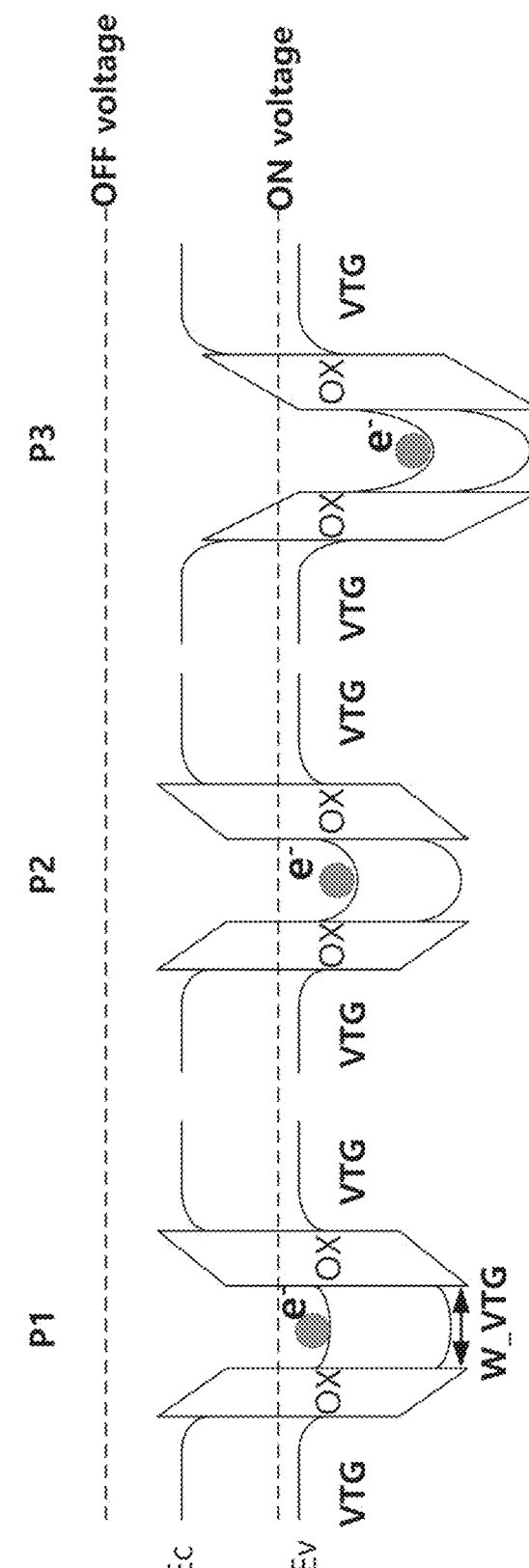
FIG. 5 is a diagram illustrating an energy band of a transfer transistor of an image sensor according to an example embodiment.

An energy band of the channel CH that is formed between the polysilicon-vertical gates VTG1 and VTG2 may be as illustrated in FIG. 5. FIG. 5 illustrates energy bands (e.g., conduction bands Ec and valence bands Ev) and positions of charges at different depths P1, P2, and P3 of the channel CH in the cross-sectional view of FIG. 4, respectively. In a polysilicon-vertical gates VTG1 and VTG2 according to various example embodiments, a region having a lowest energy potential in the channel CH may be formed in a central region of the channel CH due to a difference in work function from the channel CH while having a conductivity type different from a conductivity type of the channel CH. For example, both a conduction band Ec and a valence band Ev in the channel CH have a lowest energy potential in the central region of the channel CH. The conduction band in the central region of the channel CH is lower than a conduction band of a peripheral region of the channel CH, where the peripheral region is a portion adjacent to the polysilicon-vertical gate VTG.

According to various example embodiments, the polysilicon-vertical gates VTG1 and VTG2 may be selected from a material having a large work function to increase a difference in work function from the channel CH. As an example, when the channel CH is doped with N-type dopants, the polysilicon-vertical gates VTG1 and VTG2 may include polysilicon doped with P-type dopants.

Referring to FIG. 5, an energy potential is lowest in all paths through which charges are moved in a channel CH of a junctionless transistor according to example embodiments, so that charges are moved within the channel CH along the center of the channel CH. Accordingly, the charges may be prevented from being trapped in an interface between the channel CH and the gate insulating layer OX.

Figure 6:
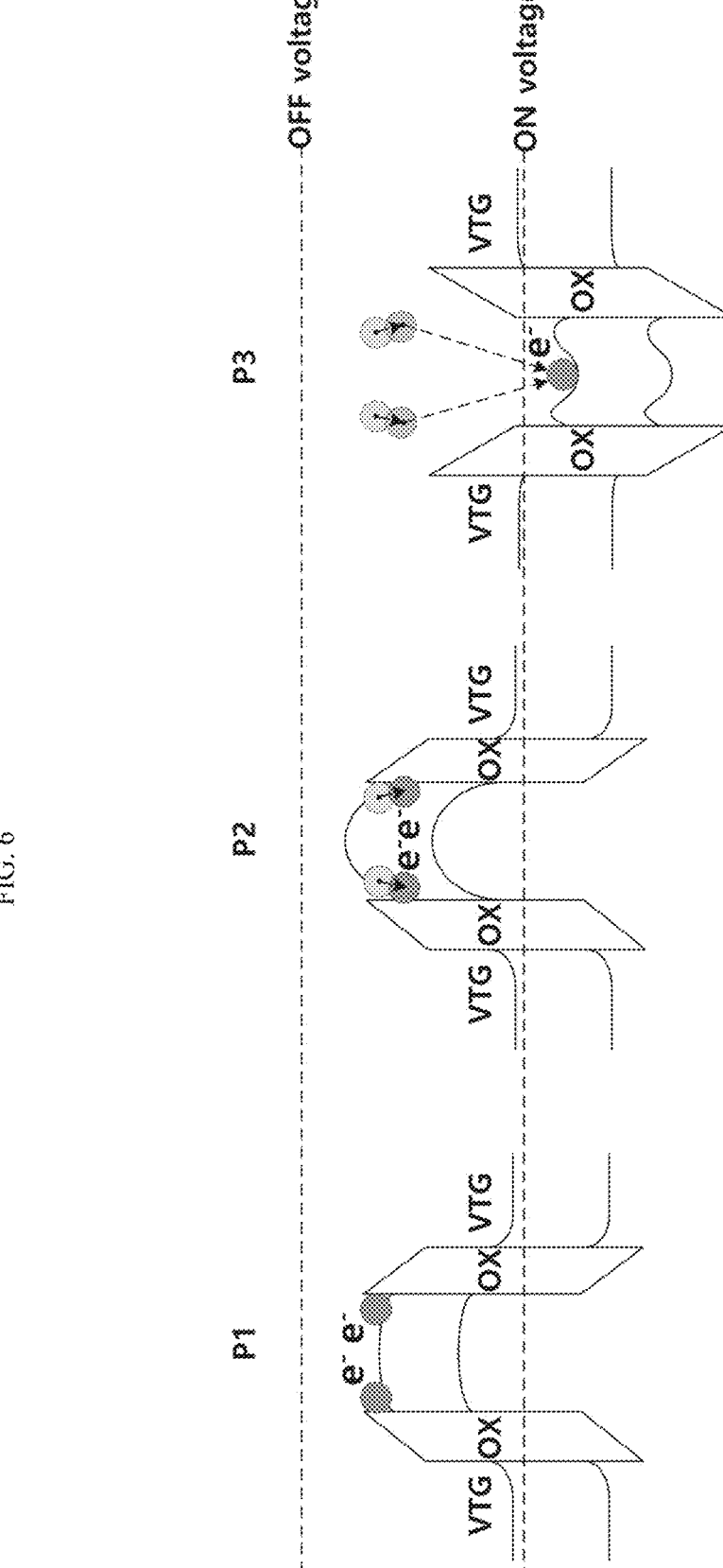
FIG. 6 is a diagram illustrating an energy band of a transfer transistor of an image sensor according to the related art.

By contrast, referring to FIG. 6, in a transfer transistor TX according to the related art based on a junction transfer transistor TX, a position of a lowest energy potential in the channel CH may vary depending on a depth of a vertical-type channel CH. Accordingly, from a position P1 in which charges enter a channel CH to a position P2 before the charges reach a position P3 of the same depth as a floating diffusion region FD, the charges are moved along an interface of the channel CH. Then, the charges are moved from the position P3 of the same depth as the floating diffusion region FD within the channel to a center in which an energy potential is lowest. Accordingly, a portion of the charges moved along the interface may be trapped in the interface and may be lost, and therefore all of the charges may not be transferred to the floating diffusion region FD, thereby causing signal loss. Thus, noise may occur. The interface trap may not be constant depending on features of formation of the transfer transistor TX. As a result, in an image sensor according to the related art, the interface trapping and an amount of the trapped charges may vary for each of a plurality of pixels, and pFPN may occur.

The image sensor 100 according to various example embodiments may use a junctionless transfer TX. Accordingly, the interface trap may not occur, and the pFPN may be reduced. For example, due to a difference in work function from the channel doped with dopants of conductivity type different from the conductivity type of the polysilicon-vertical gates VTG1 and VTG2, which are doped with P-type dopants, an energy potential around the interface may be higher than an energy potential in a central portion of the channel CH and interface trap of charges may be prevented.

Figure 7:
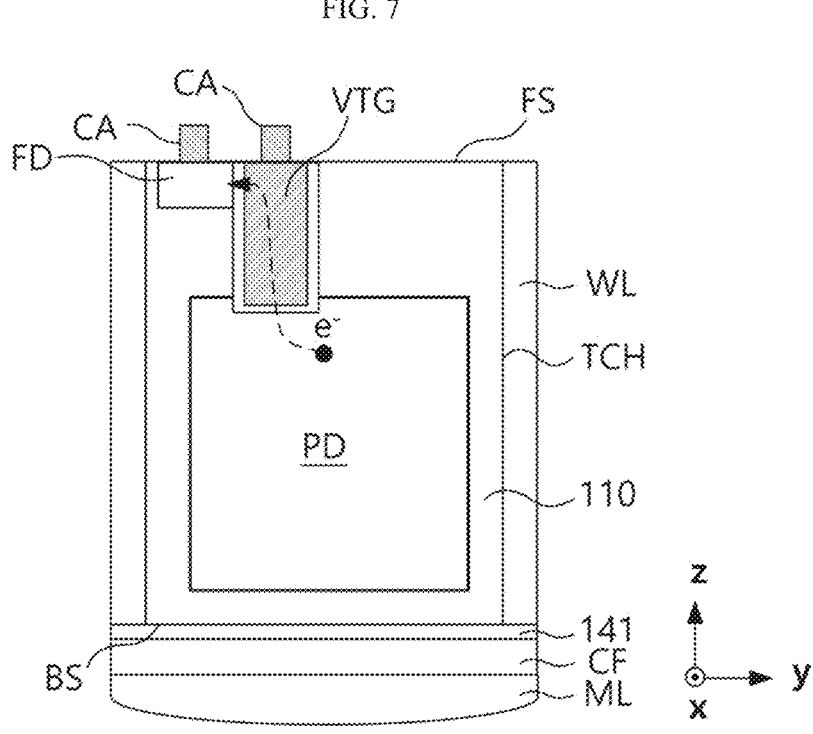
FIG. 7 is a cross-sectional view of the pixel of the image sensor of FIG. 3, taken along line II-II' in FIG. 3, according to an example embodiment.

FIG. 7 is a cross-sectional view of the pixel of the image sensor of FIG. 3, according to an example embodiment. The cross-sectional view is taken along the line II-II' in FIG. 3.

Each of the plurality of pixels, constituting the image sensor 100, may be separated from each other by a separation layer WL. The separation layer WL may be formed within a DTI trench (TCH) structure penetrating through an entirety or most of a space between the front surface FS and the back surface BS of the substrate 110 (see FIG. 1). As can be seen from FIG. 3, the DTI trench TCH may be formed to surround the pixel or may be formed to surround at least a portion of the pixel. Due to the DTI trench TCH, crosstalk may be prevented from occurring between pixels. The separation layer WL may include a conductive layer, filling the DTI trench TCH, and an insulating layer.

Returning to FIG. 7, the polysilicon-vertical gate VTG, constituting the transfer transistor TX, may be formed adjacent to the front surface FS of the substrate 110 and may extend into the substrate 110 from the front surface FS of the substrate 110 in a second direction (e.g., the Z direction). A floating diffusion region FD may be formed in a region adjacent to the polysilicon-vertical gate VTG in the second direction (the Y-direction). The photodiode PD may be formed in a relatively lower position in the third direction (the Z-direction) with respect to the front surface FS of the substrate 110 from the polysilicon-vertical gate VTG. When the pixel of the image sensor 100 is viewed in the third direction (the Z-direction) as illustrated in FIG. 3, a portion of the photodiode PD may overlap at least a portion of the floating diffusion region FD or the transfer transistor TX.

Charges, accumulated in the photodiode PD, may be moved to the channel CH in between the polysilicon-vertical gates VTG1 and VTG2 disposed thereon, and may be then moved to the adjacent floating diffusion region FD in the second direction (the Y-direction) which is perpendicular to the substrate 110.

As described above, the photodiode PD, the channel CH in between the polysilicon-vertical gates VTG1 and VTG2, and the floating diffusion region FD according to an example embodiment may be doped with dopants of the same conductivity type, and the polysilicon-vertical gates VTG1 and VTG2 may be doped with a material of a different conductivity type. Therefore, the charges may be moved to the floating diffusion region FD without passing through a PN junction and without being trapped in an interface of the channel CH. Since the channel CH is doped at a higher concentration than the photodiode PD, the charges may be efficiently moved from the photodiode PD to the channel CH.

An image sensor 100a according to an example embodiment will be described with reference to FIGS. 8 and 9. Descriptions of elements, identical or similar to those described with reference to the above drawings, will be described simply or omitted for conciseness.

Figure 8:
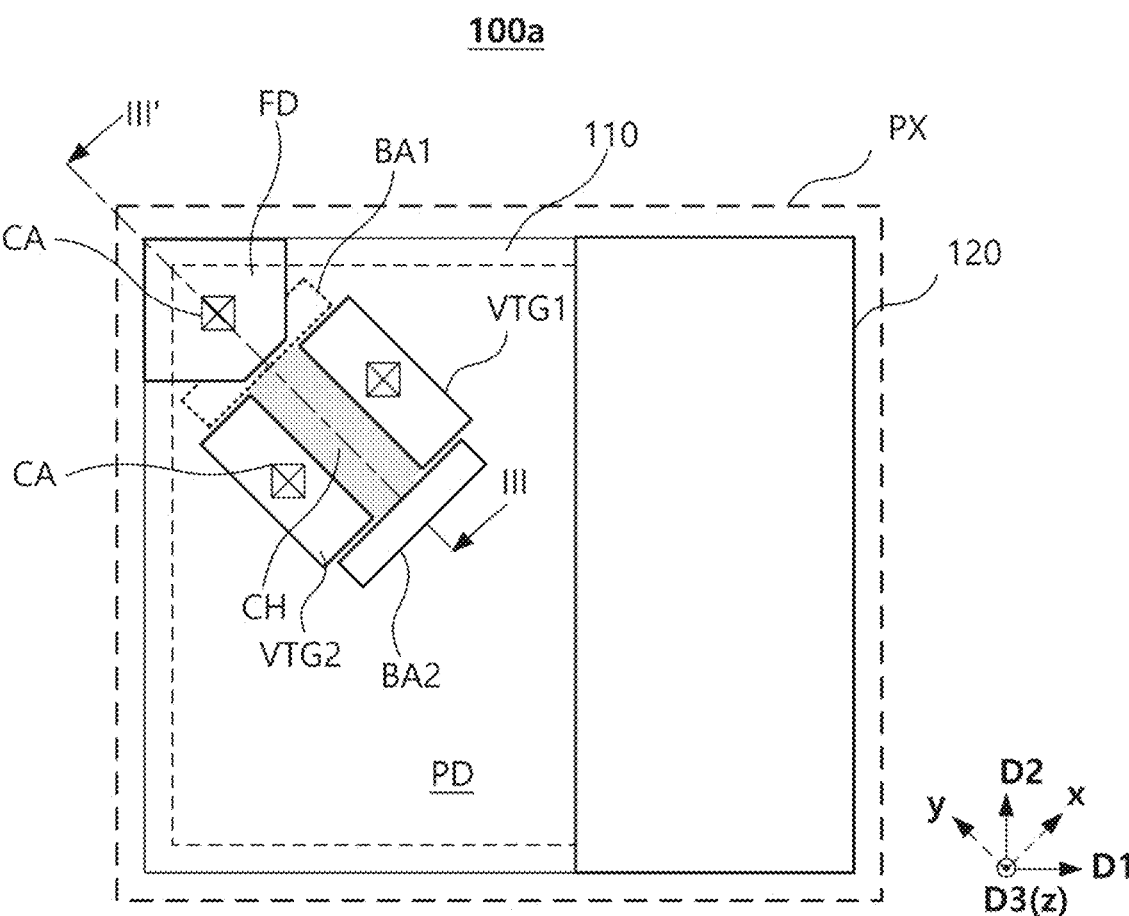
FIG. 8 is a plan view of a pixel of an image sensor according to an example embodiment.

FIG. 8 is a plan view of a pixel of an image sensor 100a according to an example embodiment.

Referring to FIG. 8, the image sensor 100a may include barriers BA1 and BA2, respectively formed in positions adjacent to the polysilicon-vertical gates VTG1 and VTG2 in the second direction (the Y-direction).

The barriers BA1 and BA2 may be formed in a plurality of positions. For example, the barriers BA1 and BA2 may be formed adjacent to the floating diffusion region FD and the polysilicon-vertical gates VTG1 and VTG2, or may be formed adjacent to the photodiode PD and the polysilicon-vertical gates VTG1 and VTG2.

When the pixel of the image sensor 100 is viewed in the third direction (the Z-direction), at least a portion of the barriers BA1 and BA2 may overlap at least a portion of the floating diffusion region FD and/or at least a portion of the transfer transistor TX.

The barriers BA1 and BA2 may be doped with a material of a conductivity type that is different from a conductivity type of the floating diffusion region FD. In some example embodiments, the barrier BA2 may be formed using a shallow trench isolation (STI) process When viewed in plan view, the barriers BA1 and BA2 may be formed to have a length extending in the first direction (the X-direction) to cover an opened region between the polysilicon-vertical gates VTG1 and VTG2.

Figure 9:
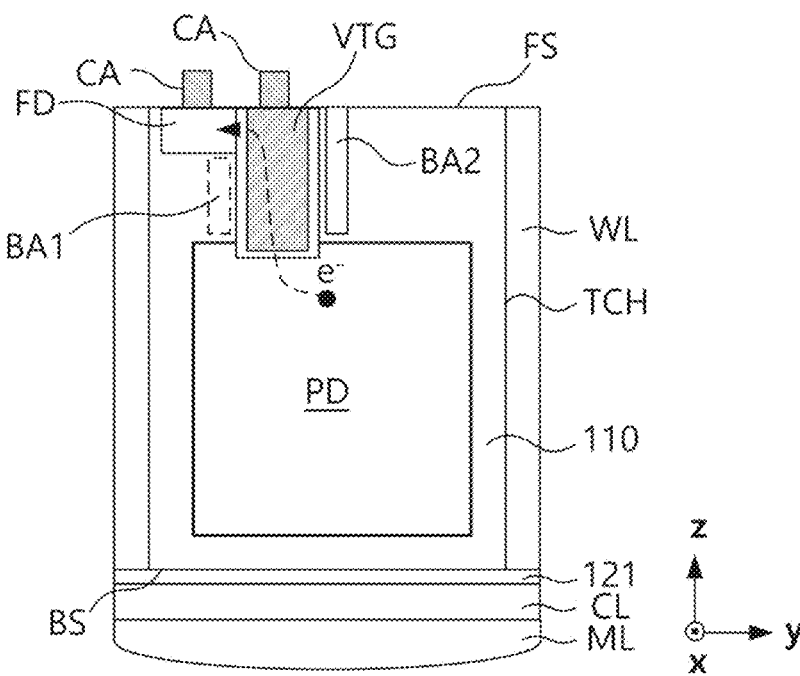
FIG. 9 is a cross-sectional view of the pixel of the image sensor of FIG. 8, according to an example embodiment.

FIG. 9 is a cross-sectional view of the pixel of the image sensor 100a, according to an example embodiment. FIG. 9 is a cross-sectional view of the pixel, taken along line III-III' of FIG. 8.

The barriers BA1 and BA2 may be formed within the substrate 110 at different heights in the third direction (the Z-direction). For example, positions (e.g., a top surface) of the barriers BA1 and BA2 that are closest to the front surface SF of the substrate 110 may be different from each other within the substrate 110.

Among the barriers BA1 and BA2, the barrier BA1 that is adjacent to the floating diffusion region FD may be doped with a material of a conductivity type that is different from a conductivity type of the channel CH and may be formed below the floating diffusion region FD with respect to the front surface SF of the substrate 110. Accordingly, when the photodiode PD, the channel CH, and the floating diffusion region FD are doped with N-type conductive materials, the barrier BA1 may be doped with P-type dopants. In this case, the barrier BA1 may be formed to extend in the first direction (the X-direction) to cover an opened portion of a vertical extension region of the polysilicon-vertical gates VTG1 and VTG2 and to extend to a position that is adjacent to the photodiode PD in the third direction (the Z-direction), as illustrated in FIG. 9. In other words, a bottom surface of the barrier BA1 may be adjacent to the photodiode PD in the third direction (the Z-direction). In some example embodiments, when a lower surface of the vertical extension region of the polysilicon-vertical gates VTG1 and VTG2 is formed to be spaced apart from a front surface FS of the substrate 110, the barrier BA1 may be formed to extend to a positon, in which the vertical extension region of the polysilicon-vertical gate VTG ends, in the third direction (the Z-direction). Accordingly, the barrier BA1 may prevent charges, passing through the channel CH, from leaking to the substrate 110 without reaching the floating diffusion region FD.

Among the barriers BA1 and BA2, the barrier BA2 that is disposed to be spaced apart from the floating diffusion region FD may be doped with a material of a conductivity type that is different from a conductivity type of the channel CH. In some example embodiments, the barrier BA2 may be using an STI process. The barrier BA2 formed using the STI process may be formed by thermally oxidizing an interface of a trench to form an oxide layer after etching a portion of an epitaxial layer of the substrate 110 and then depositing a remaining space with an oxide. In some example embodiments, an internal trench of the oxide layer on the interface may be filled with an insulating material, or may be filled with a high-density plasma (HDP) oxide layer or a chemical vapor deposition (CVD) oxide layer.

The barrier BA2, which is disposed to be spaced apart from the floating diffusion region FD, may be formed to cover a portion of an opening of the vertical extension region of the polysilicon-vertical gates VTG1 and VTG2. The barrier BA2 may be formed to vertically extend from the front surface FS of the substrate 110 to a position that is adjacent to the photodiode PD in the third direction (the Z-direction). Accordingly, the barrier BA2 may prevent charges that have been moved from the photodiode PD to the channel CH from leaking from the channel CH to the substrate 110.

An image sensor 100b according to an example embodiment will be described with reference to FIGS. 10 and 11. Descriptions of elements, identical or similar to those described with reference to the above drawings, will be described simply or omitted for conciseness.

Figure 10:
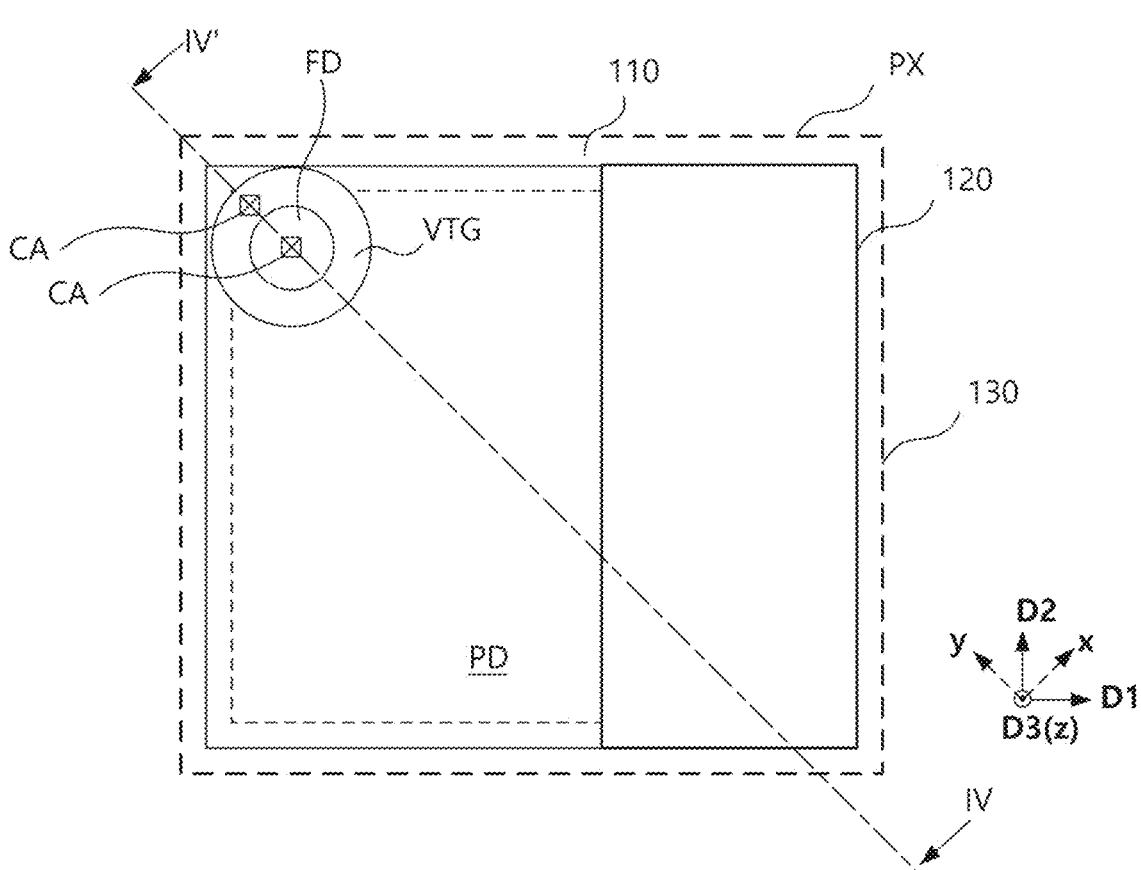
FIG. 10 is a plan view of a pixel of an image sensor according to an example embodiment.

FIG. 10 is a plan view of a pixel of the image sensor 100a according to an example embodiment.

A polysilicon-vertical gate of a transfer transistor TX may have a ring shape when the pixel of the image sensor 100a is viewed in a third direction (the Z-direction).

A floating diffusion region FD may be disposed in a space inside the ring of the polysilicon-vertical gate VTG. The floating diffusion region FD may be electrically connected to a reset transistor RX through a contact area CA.

When the image sensor 100b is viewed in plan view as illustrated in FIG. 10, at least a portion of the polysilicon-vertical gate VTG may overlap at least a portion of the photodiode PD. When the image sensor 100b is viewed in plan view, at least a portion of the polysilicon-vertical gate VTG may overlap at least a portion of the channel CH. At least a portion of the polysilicon-vertical gate VTG may overlap both the channel CH and the photodiode PD.

Figure 11:
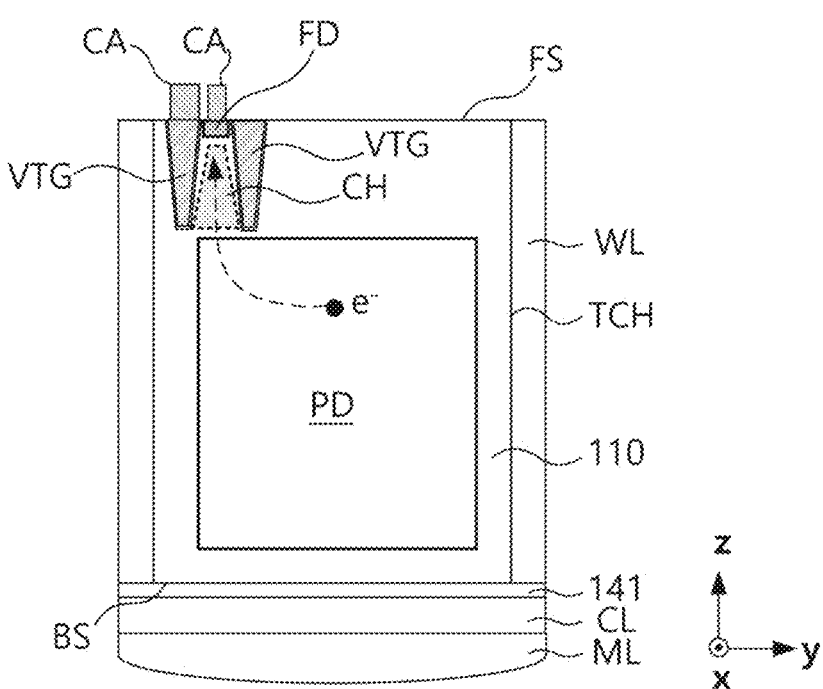
FIG. 11 is a cross-sectional view of the pixel of the image sensor of FIG. 10, according to an example embodiment.

FIG. 11 is a cross-sectional view of the pixel of the image sensor of FIG. 10, according to an example embodiment, and is a cross-sectional view of the pixel, taken along line IV-IV' of FIG. 10.

A polysilicon-vertical gate VTG may be formed in a ring shape extending from the front surface FS of a substrate 110 in the third direction (the Z-direction). Accordingly, the polysilicon-vertical gate VTG may include a hollow cylindrical vertical extension region extending from the front surface FS of the substrate 110 in the third direction. In some embodiments, a thickness of the ring (a distance between an inner circle and an outer circle) of the polysilicon-vertical gate VTG may be decreased in the third direction.

In the ring of the polysilicon-vertical gate VTG, a floating diffusion region FD may be formed in an upper region of the substrate 110 adjacent to the front surface FS of the substrate 110, and a channel CH may be formed below the floating diffusion region FD.

The photodiode PD may be formed below the polysilicon-vertical gate VTG and the channel CH. Accordingly, in a charge transfer mode, the transfer transistor TX may be turned on and charges accumulated in the photodiode PD may be moved to the channel CH disposed in a relatively upper portion with respect to the photodiode PD. The charges in the channel CH may be continuously moved to the floating diffusion region FD, which is disposed above the channel CH, in the third direction (the Z-direction).

In FIGS. 10 and 11, the polysilicon-vertical gate VTG may be formed in a hollow cylindrical shape. Accordingly, the channel CH and the floating diffusion region FD may be formed within the polysilicon-vertical gate VTG and leakage of charges may be prevented without a barrier.

An image sensor 200 according to an example embodiment will be described with reference to FIGS. 12 and 13. Descriptions of elements, identical or similar to those described with reference to the above drawings, will be described simply or omitted for conciseness.

Figure 12:
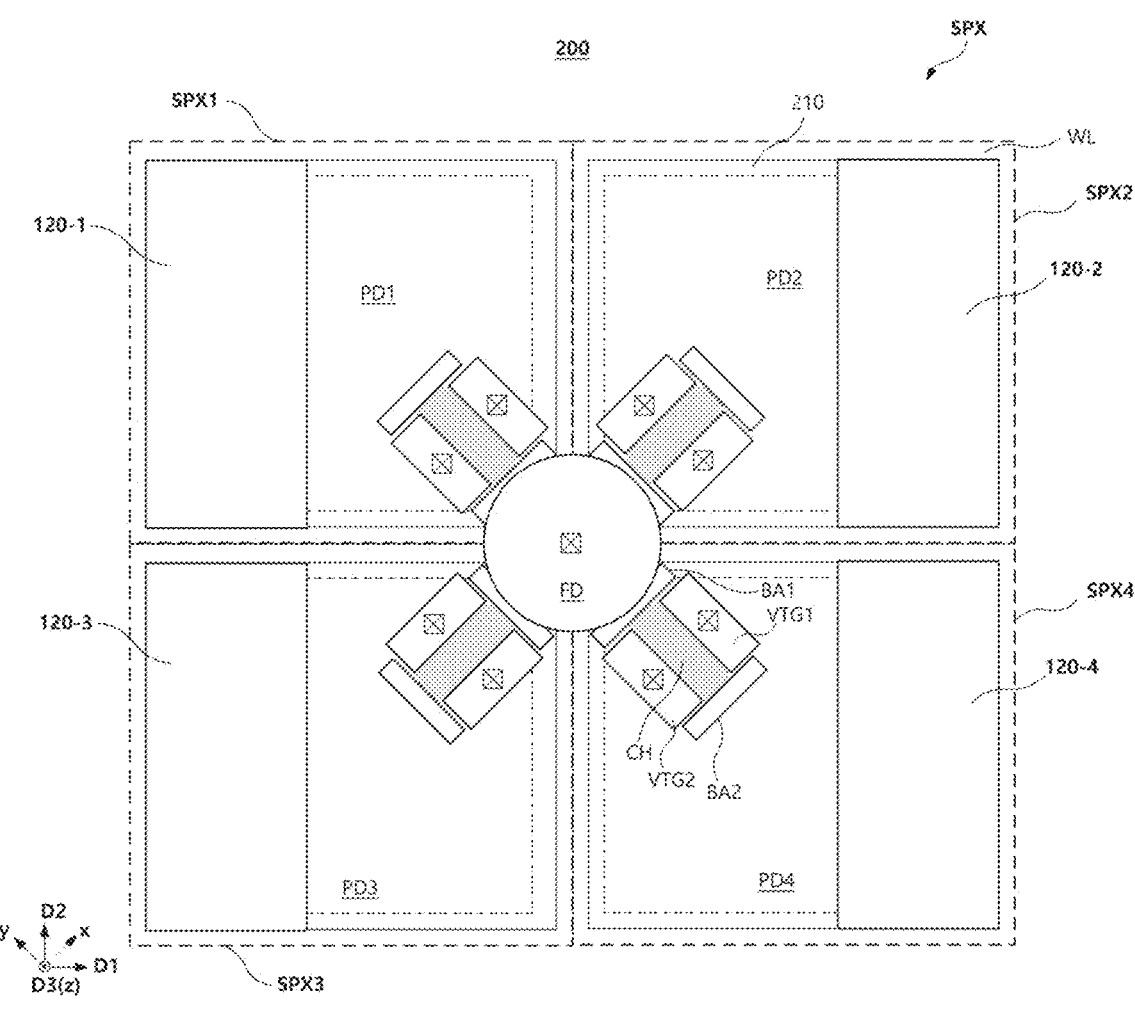
FIG. 12 is a plan view of pixels of an image sensor according to an example embodiment.
Figure 13:
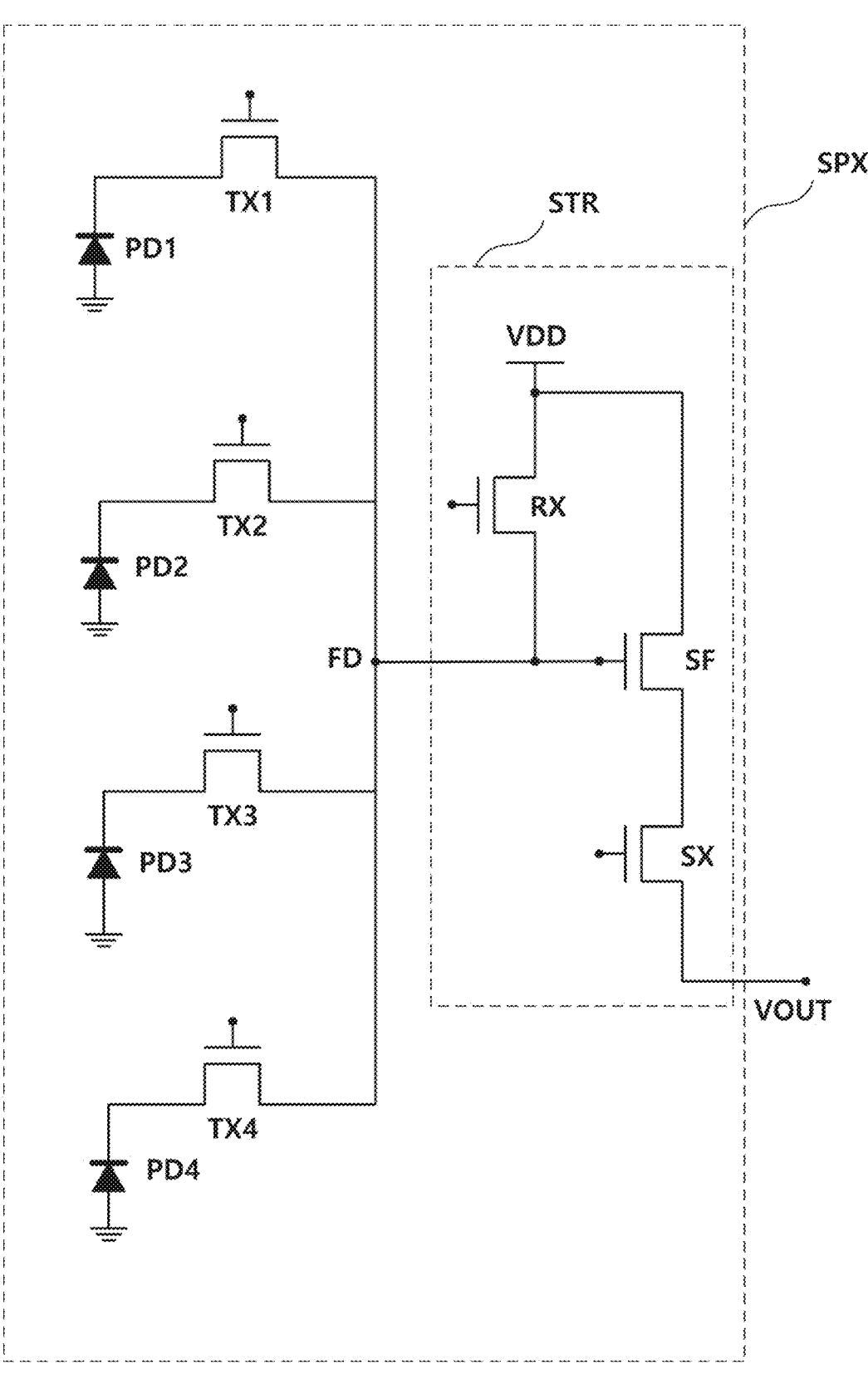
FIG. 13 is a circuit diagram of the pixel of the image sensor of FIG. 12, according to an example embodiment.

FIG. 12 is a plan view of pixels of the image sensor 200 according to an example embodiment. FIG. 13 is a circuit diagram of a shared pixel structure.

The image sensor 200 may include a plurality of shared pixel structures SPX, and each of the plurality of shared pixel structure SPX may include a plurality of shared pixels SPX1 to SPX4. Each of the shared pixels SPX1 to SPX4 of the shared pixel structure SPX may be electrically insulated from each other by a separation layer WL, and may be the above-described DTI structure or formation of a trench to a desired depth in the substrate 210. The separation layer WL may include an insulating layer.

The plurality of shared pixels SPX1 to SPX4 of the shared pixel structure SPX may share the same floating diffusion region FD. Although a structure including barriers BA1 and BA2 will be described in the example embodiment of FIG. 12, in some example embodiments, the shared pixel structure SPX may be formed based on the structure described above with reference to FIG. 3.

The plurality of shared pixels SPX1 to SPX4 may include TR areas 120-1 to 120-4, respectively. Among shared transistors STR (see FIG. 13), different transistors may be disposed in each of the TR areas 120-1 to 120-4, and each of the shared pixels SPX1 to SPX4 may share a shared transistor STR. For example, the reset transistor RX, the source-follower transistor SF, and the select transistor SX described with reference to FIG. 2 may be disposed to be separate from each other in the TR areas 120-1 to 120-4.

Each of the shared pixels SPX1 to SPX4 may have a polysilicon-vertical gates VTG1 and VTG2 of an individual transfer transistor TX (TX1 to TX4). Each of the shared pixels SPX1 to SPX4 may turn on or turn off the individual transfer transistor TX (TX1 to TX4) to transmit charges of a photodiodes PD (PD1 to PD4) of each of the shared pixels SPX1 to SPX4 to the shared floating diffusion region FD.

The individual transistors TX (TX1 to TX4) of each of the shared pixels SPX1 to SPX4 are junctionless transistors as described above, and the photodiodes PD (PD1 to PD4), channels CH, and floating diffusion regions FD may be doped with dopants of the same conductivity type, and the polysilicon-vertical gates VTG may have a conductivity type different therefrom. Accordingly, charges accumulated in each of the photodiodes PD (PD1 to PD4) may be transferred to the shared floating diffusion region FD without being trapped in an interface of each of the channels CH and without passing through a PN junction.

An image sensor 200a according to an example embodiment will be described with reference to FIG. 14. Descriptions of elements, identical or similar to those described with reference to the above drawings, will be described simply or omitted for conciseness.

Figure 14:
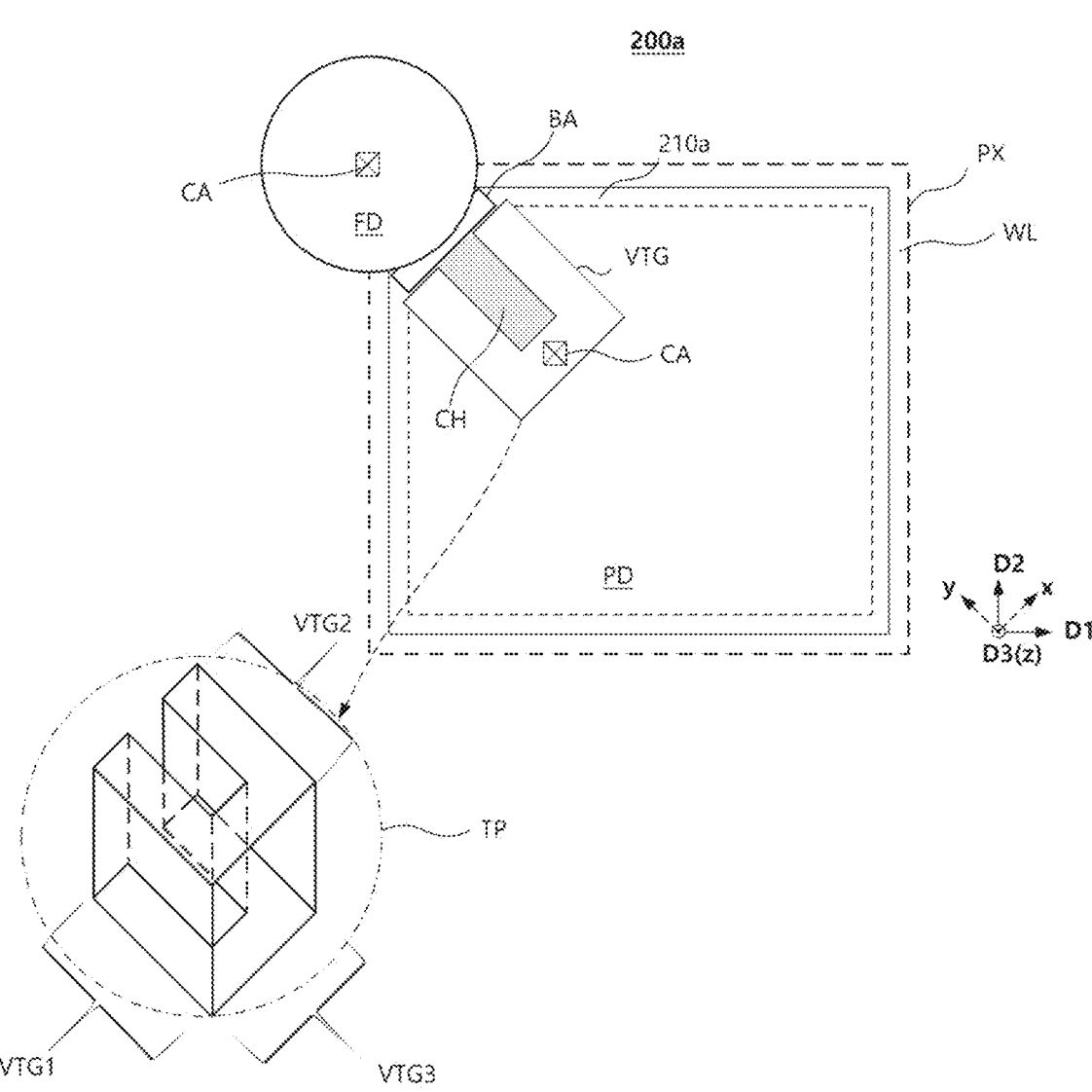
FIG. 14 is a plan view of a pixel of an image sensor according to an example embodiment.

FIG. 14 illustrates a plan view of a pixel of the image sensor 200a according to an example embodiment and a three-dimensional perspective view (TP) of a polysilicon-vertical gate VTG of the image sensor 200a.

The pixel of the image sensor 200a described with reference to FIG. 14 is a single one pixel of the shared pixel structure SPX described with reference to FIG. 12. Therefore, a floating diffusion region FD and some transistors may be shared with other shared pixels, similarly to the configuration described with respect to FIG. 12, and detailed descriptions thereof will be omitted for conciseness. However, the example embodiment described with reference to FIG. 14 is not necessarily used only in a shared pixel structure. As described with reference to FIG. 3, the example embodiment described with reference to FIG. 14 may be used in the same manner in a structure in which each pixel individually includes a floating diffusion region FD.

When viewed in plan view in the third direction (the Z-direction) perpendicular to a front surface FS of a substrate 210a, the pixel of the image sensor 200a may have a U-shaped polysilicon-vertical gate VTG having an opening facing a floating region FD. When viewed in plan view, at least a portion of the polysilicon-vertical gate VTG may overlap a photodiode PD. When viewed in plan view, the polysilicon-vertical gate VTG may be formed to surround a channel CH in three directions.

Referring to the three-dimensional perspective view TP of the polysilicon-vertical gate VTG, a U-shaped cross-section of the polysilicon-vertical gate VTG may be formed by vertically extending of the polysilicon-vertical gate VTG into the substrate 110 in the third direction (the Z-direction). The polysilicon-vertical gate VTG may include a plurality of vertical extension regions VTG1, VTG2, and VTG3. Among the vertical extension regions VTG1, VTG2, and VTG3, some vertical extension regions VTG1 and VTG2 may be spaced apart from each other in a first direction (the X-direction) parallel to the front surface FS of the substrate with the channel CH interposed therebetween, and another vertical extension region VTG3 may be formed to connect the vertical extension regions VTG1 and VTG2 to each other while extending in the third direction (the Z-direction).

The channel CH may be formed to vertically extend in the third direction along with the extension of the polysilicon-vertical gate VTG in the third direction.

The pixel of the image sensor 200a according to an example embodiment may include a barrier BA covering a portion of an opening of the polysilicon-vertical gate VTG directed toward the floating diffusion region FD. The barrier BA may be formed to vertically extend to a position, adjacent to the photodiode PD, in the third direction (the Z-direction). In some example embodiments, when a lower surface of the vertical extension region of the polysilicon-vertical gate VTG is formed to be spaced apart from the front surface FS of the photodiode, the barrier BA may be formed to extend in the third direction to a position, in which the vertical extension region of the polysilicon-vertical gate VTG ends.

The barrier BA may be doped with a material of conductivity type that is different from a conductivity type of the channel CH. When viewed in plan view, at least a portion of the barrier BA may overlap the floating diffusion region FD.

An image sensor 300 according to an example embodiment will be described with reference to FIGS. 15 and 16. Descriptions of elements, identical or similar to those described with reference to the above drawings, will be described simply or omitted for conciseness.

Figure 15:
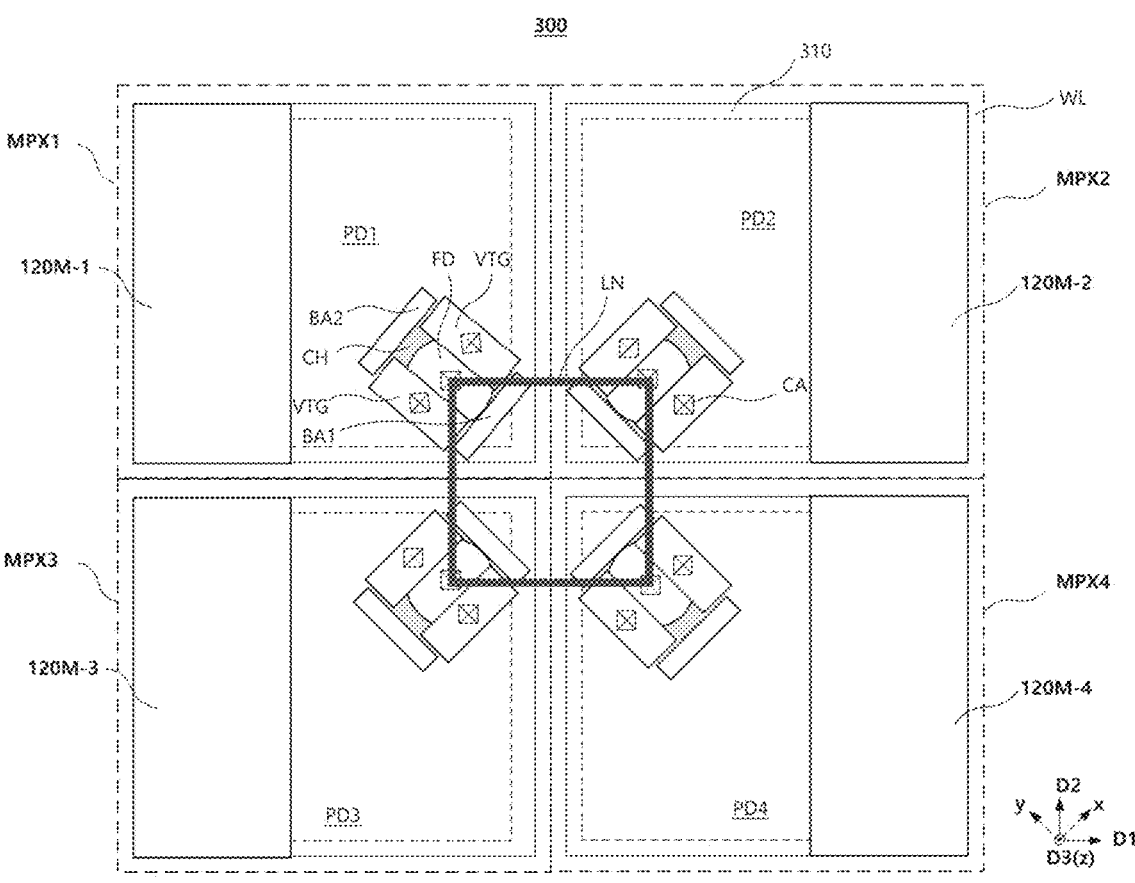
FIG. 15 is a plan view of a pixel of an image sensor according to an example embodiment.

FIG. 15 is a plan view of a pixel structure of the image sensor 300 according to an example embodiment.

The image sensor 300 may include a plurality of pixel structures including a plurality of shared pixels MPX1 to MPX4.

Each of the shared pixels MPX1 to MPX4 of the pixel structure may be electrically insulated by a separation layer WL, and may be the above-described DTI structure or may be formed of a trench only to a desired depth of a substrate. The separation layer WL may include an insulating layer.

Each of the plurality of shared pixels MPX1 to MPX4 of the shared pixel structure may include an individual floating diffusion region FD and may share the individual floating diffusion region FD through metal lines LN.

In the image sensor 300, the floating diffusion region FD may be disposed to overlap at least a portion of the photodiode PD and at least a portion of the channel CH, when viewed in plan view.

Each of the plurality of shared pixels MPX1 to MPX4 may include TR areas 120M-1 to 120M-4. Among different shared transistors, different transistors may be disposed in each of the TR areas 120M-1 to 120M-4, and each of the shared pixels MPX1 to MPX4 may share shared transistors. For example, the reset transistor RX, the source-follower transistor SF, and the select transistor SX described with reference to FIG. 2 may be disposed to be separate from each other in the TR areas 120-1 to 120-4.

Each of the shared pixels MPX1 to MPX4 may include an individual transfer transistor TX and an individual floating diffusion region FD. However, the floating diffusion regions FD of the respective shared pixels MPX1 to MPX4 may be electrically shared through the metal lines LN. Accordingly, each of the shared pixels MPX1 to MPX4 when viewed in plan view may have an area, smaller than an area of the floating diffusion region FD of FIG. 3. Each of the shared pixel MPX1 to MPX4 may have an individual polysilicon-vertical gate VTG. Each of the shared pixels MPX1 to MPX4 may turn on or turn off an individual transfer transistor TX to transfer charges of the photodiode PD (PD1 to PD4) of each of the shared pixels MPX1 to MPX4 to the electrically shared floating diffusion region FD through the metal lines LN.

The individual transfer transistors TX of the respective shared pixel MPX1 to MPX4 are junctionless transistors, as described above. Charges accumulated in each of the photodiodes PD (PD1 to PD4) may be electrically transferred to the shared floating diffusion region FD without being trapped in an interface of each channel CH and without passing through a PN junction.

Figure 16:
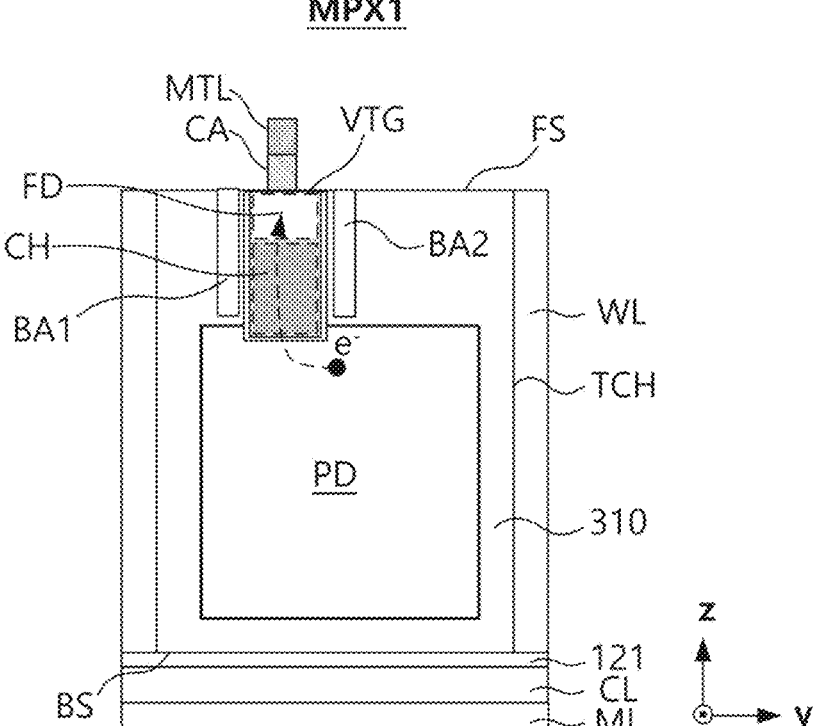
FIG. 16 is a cross-sectional view of the pixel of the image sensor of FIG. 15, according to an example embodiment.

FIG. 16 is a cross-sectional view of the pixel MPX1 of the image sensor 300, by way of example.

The polysilicon-vertical gate VTG, constituting the transfer transistor TX, may be formed adjacent to a front surface FS of a substrate 310 and may extend into the substrate 310 from the front surface FS in the third direction (the Z-direction). The floating diffusion region FD may be formed between polysilicon-vertical gates VTG spaced apart from each other in a first direction (for example, the X-direction in the case of pixel MPX1). The channel CH may be formed below the floating diffusion region FD between the polysilicon-vertical gates VTG. The photodiode PD may be formed in a relatively lower position in the third direction (the Z-direction) from the polysilicon-vertical gate VTG and the channel CH with respect to the front surface FS of the substrate 310.

Charges, accumulated in the photodiode PD, may be moved to the channel CH in an overlying polysilicon-vertical gate VTG in the third direction (the Z-direction), and may then be moved to the floating diffusion region FD, disposed above the channel CH, in the third direction.

As described above, a photodiode, a channel between polysilicon-vertical gates VTG, and a floating diffusion region FD according to an example embodiment may be doped with dopants of the same conductivity type, and the polysilicon-vertical gates VTG may be doped with a material of a different conductivity type. Accordingly, the charges may be moved to the floating diffusion region FD without being trapped in the interface of the channel CH and without passing through a PN junction.

The floating diffusion region FD according to an example embodiment may overlap the channel CH when viewed in plan view, and may be disposed above the channel CH in the polysilicon-vertical gate VTG in the third direction. Accordingly, capacitance may be reduced due to a small area of the floating diffusion region FD, allowing a high gain to be used in an image sensor. By contrast, when a floating diffusion region FD according to the related art is doped with N-type dopants, capacitance may be significantly high due to a junction to a P-type substrate.

Barriers BA1 and BA2 according to an example embodiment may be formed to the same depth from the front surface FS of the substrate in the third direction (the Z-direction).

The barriers BA1 and BA2 may be doped with a material of a conductivity type, different from a conductivity type of the channel CH, to be formed or may be formed using an STI process. When the barriers BA1 and BA2 are formed using the STI process, the barriers BA1 and BA2 may cover an opening of the polysilicon-vertical gate VTG. Accordingly, the barriers BA1 and BA2 may be formed to vertically extend from the front surface FS of the substrate to a depth, at which the barriers BA1 and BA2 are disposed adjacent to the photodiode PD or one end of the polysilicon-vertical gate VTG is disposed. As a result, the barriers BA1 and BA2 may prevent the charges, moved from the photodiode PD to the channel CH, from leaking from the channel CH to the substrate.

Figure 17:
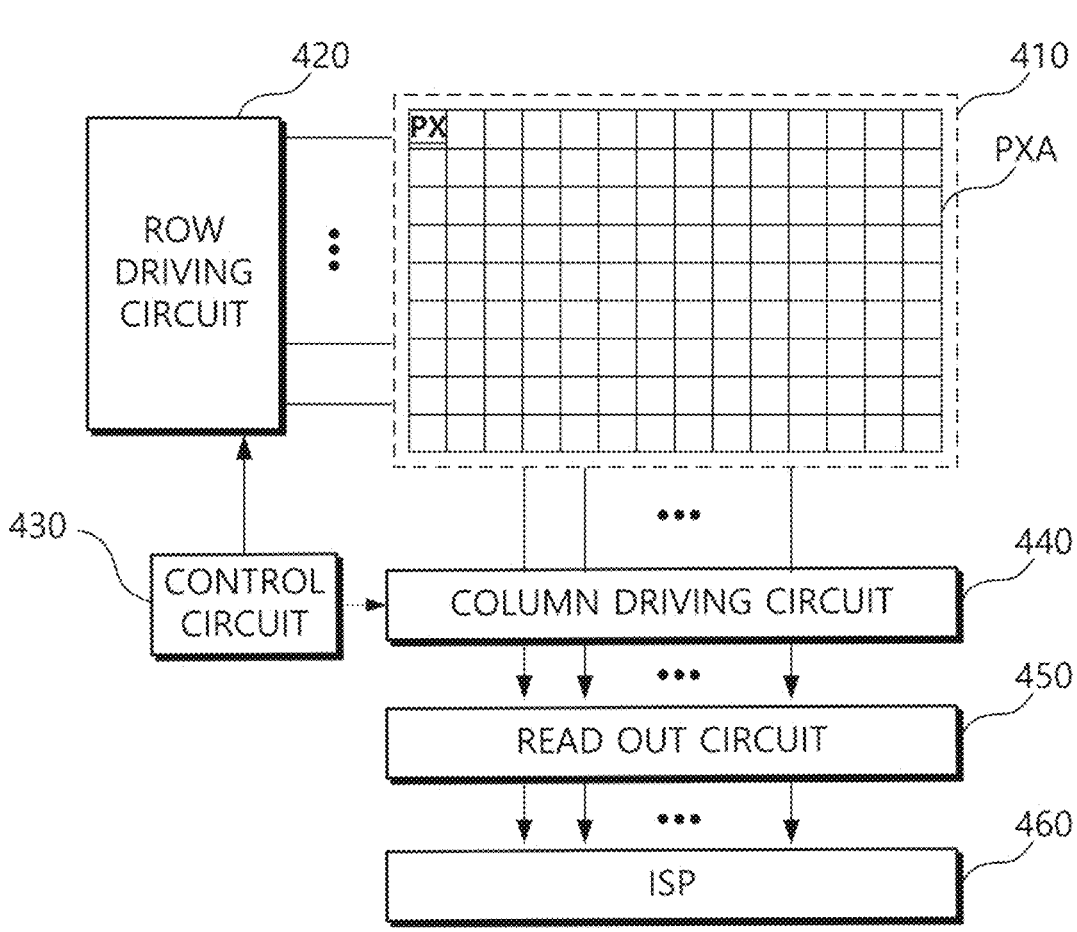
FIG. 17 is a block diagram illustrating an image sensor according to an example embodiment.

FIG. 17 is a block diagram of an image sensor 400 according to an example embodiment. Descriptions of elements, identical or similar to those described with reference to the above drawings, will be described simply or omitted for conciseness.

Referring to FIG. 17, the image sensor 400 may include a pixel array PXA, a row driving circuit 420, a control circuit 430, a column driving circuit 440, a readout circuit 450, and an image signal processor (ISP) 460. The pixel array PXA may include at least one of the image sensors according to example embodiments described with respect to FIGS. 1-16.

The pixel array PXA may include a plurality of two-dimensionally arranged unit pixels, and may be formed in an active region 410.

The unit pixels of the pixel array PXA may provide an output voltage at a time in units of rows. The row driving circuit 420 may provide a plurality of driving signals for driving unit pixels, disposed in the same row, to the pixel array PXA.

The control circuit 430 may control the row driving circuit 420 and the column driving circuit 440. To this end, the control circuit 430 may provide control signals, such as a clock signal, a timing control signal, or the like, to the row driving circuit 420 and the column driving circuit 440.

Unit pixels, belonging to a selected row, may provide an output voltage corresponding to an optical signal to an output line of a column corresponding to each pixel.

The column driving circuit 440 may include a correlated double sampler CDS sampling an output of a pixel twice to remove noise, and may decode an address in a column direction of the pixel array PXA.

The readout circuit 450 may include an amplifier amplifying an analog signal, an output voltage, an analog-to-digital converter converting an analog signal into a digital signal, or the like.

The image signal processor ISP may de-mosaic an image signal based on a pixel pattern through interpolation or the like, perform color correction, adjust a dynamic range, or reduce noise through filtering or the like. The image signal processor ISP may additionally perform a method of improving image quality, other than the above operations.

As set forth above, an image sensor according to example embodiments may reduce noise of a generated image.

While example embodiments have been shown and described above, it will be apparent to those skilled in the art that modifications and variations could be made without departing from the scope of the present inventive concept as defined by the appended claims.

What is claimed is:

1. An image sensor comprising:
a substrate having a front surface and a back surface that opposes the front surface;
a polysilicon-vertical gate disposed in an upper region adjacent to the front surface of the substrate and extending into the substrate;
a photoelectric conversion element disposed at a lower position within the substrate with respect to the polysilicon-vertical gate;
a channel disposed adjacent to the polysilicon-vertical gate and doped with dopants of a same conductivity type as the photoelectric conversion element; and
a floating diffusion region disposed in the upper region of the substrate and adjacent to the polysilicon-vertical gate in a first parallel direction that is parallel to the front surface of the substrate,
wherein the polysilicon-vertical gate, the photoelectric conversion element, and the floating diffusion region constitute a junctionless transfer transistor.

2. The image sensor of claim 1, wherein:
the channel and the floating diffusion region are doped with dopants of the same conductivity type.

3. The image sensor of claim 2, wherein:
a doping concentration of the channel is higher than a doping concentration of the photoelectric conversion element.

4. The image sensor of claim 2, wherein:
the polysilicon-vertical gate is doped with dopants of a first conductivity type that is different from a second conductivity type of the photoelectric conversion element, the channel, and the floating diffusion region.

5. The image sensor of claim 1, wherein:
the photoelectric conversion element, the channel, and the floating diffusion region are doped with N-type dopants, and the polysilicon-vertical gate is doped with P-type dopants.

6. The image sensor of claim 1, wherein:
electrons of the photoelectric conversion element are transferred to the floating diffusion region through the channel without passing through a PN junction.

7. The image sensor of claim 1, wherein:
the polysilicon-vertical gate has a plurality of vertical extension regions that extend in a perpendicular direction that is perpendicular to the front surface of the substrate, and at least a portion of the plurality of vertical extension regions are spaced apart from each other in a second parallel direction that is parallel to the front surface of the substrate with the channel interposed therebetween.

8. The image sensor of claim 7, comprising:

a plurality of barriers that are adjacent to each other in the first parallel direction and that extend from the polysilicon-vertical gate in the perpendicular direction.

9. The image sensor of claim 8, wherein:

among the plurality of barriers, a barrier that is adjacent to the floating diffusion region is doped with P-type dopants and is disposed below the floating diffusion region.

10. The image sensor of claim 7, wherein:

the plurality of vertical extension regions comprise a plurality of first vertical extension regions that are disposed spaced apart from each other in the second parallel direction with the channel interposed therebetween, and a second vertical extension region that extends in the second parallel direction and the perpendicular direction and connects the plurality of first vertical extension regions to each other.

11. The image sensor of claim 7, wherein:

the channel includes a central region and a peripheral region between the central region and the plurality of vertical extension regions, and the central region has a lower conduction band than the peripheral region.

12. The image sensor of claim 7, wherein:

the at least a portion of the plurality of vertical extension regions are spaced apart from each other by a distance, and a depletion region having a width equal to the distance is formed in the channel when a negative voltage is applied to the polysilicon-vertical gate.

13. The image sensor of claim 1, wherein the polysilicon-vertical gate has a plurality of vertical extension regions that extend in a perpendicular direction that is perpendicular to the front surface of the substrate, and wherein the floating diffusion region is disposed between the plurality of vertical extension regions and is disposed to overlap the photoelectric conversion element when viewed in the perpendicular direction.

14. The image sensor of claim 13, wherein:

the floating diffusion regions of at least two different pixels are connected to each other by metal lines.

15. The image sensor of claim 1, wherein the polysilicon-vertical gate has a cylindrical vertical extension region that extends in a perpendicular direction and has an inner hollow portion that is perpendicular to the front surface of the substrate, and wherein the floating diffusion region is disposed in the inner hollow portion of the cylindrical vertical extension region and is disposed to overlap the photoelectric conversion element when viewed in the perpendicular direction.

16. An image sensor comprising:

a substrate having a front surface and a back surface that opposes the front surface;

a polysilicon-vertical gate disposed in an upper region adjacent to the front surface of the substrate and extending into the substrate;

a photoelectric conversion element that is disposed at a lower position within the substrate with respect to the polysilicon-vertical gate and that is doped with dopants of a first conductivity type that is different from a second conductivity type of the polysilicon-vertical gate;

a channel disposed adjacent to the polysilicon-vertical gate and doped with dopants of the first conductivity type; and a floating diffusion region that is formed in an upper position of the substrate adjacent to the polysilicon-vertical gate in a first parallel direction that is parallel to the front surface of the substrate, and doped with dopants of the first conductivity type, wherein the photoelectric conversion element accumulates photocharges corresponding to an intensity of incident light when a negative voltage is applied to the polysilicon-vertical gate, and transfers the accumulated photocharges to the floating diffusion region through the channel in the polysilicon-vertical gate when the negative voltage applied to the polysilicon-vertical gate is released.

17. The image sensor of claim 16, wherein:

the accumulated photocharges are transferred to the floating diffusion region through the channel without passing through a PN junction.

18. The image sensor of claim 16, wherein:

the polysilicon-vertical gate has a plurality of vertical extension regions that extend in a perpendicular direction that is perpendicular to the front surface of the substrate, and at least a portion of the plurality of vertical extension regions are disposed spaced apart from each other in a second parallel direction that is parallel to the front surface of the substrate with the channel interposed therebetween, the channel includes a central region and a peripheral region between the central region and the plurality of vertical extension regions, and the central region has a lower conduction band than the peripheral region.

19. The image sensor of claim 18, comprising:

a plurality of barriers that are adjacent to each other in the first parallel direction and that extend from the polysilicon-vertical gate in the perpendicular direction, wherein among the plurality of barriers, a barrier that is adjacent to the floating diffusion region is doped with dopants of a conductivity type that is different from the first conductivity type of the floating diffusion region.

20. An image sensor comprising:

a pixel array comprising a plurality of pixels; and a control circuit configured to transmit a control signal to a plurality of transfer transistors included in each of the plurality of pixels, wherein each of the plurality of pixels comprises:

a polysilicon-vertical gate of a transfer transistor, the polysilicon-vertical gate being disposed in an upper region adjacent to a front surface of a substrate and extending into the substrate;

a photoelectric conversion element that is doped with dopants of a first conductivity type that is different from a second conductivity type of the polysilicon-vertical gate, the photoelectric conversion element being disposed at a lower position within the substrate with respect to the polysilicon-vertical gate;

a channel disposed adjacent to the polysilicon-vertical gate and doped with dopants of the first conductivity type; and a floating diffusion region that is spaced apart from the photoelectric conversion element and doped with dopants of the first conductivity type and that stores charges transferred from the photoelectric conversion element through the channel in the polysilicon-vertical gate, wherein the charges of the photoelectric conversion element are transferred to the floating diffusion region through the channel without passing through a PN junction.

* * * * *